United States Patent
Hwang et al.

(10) Patent No.: US 6,835,276 B2
(45) Date of Patent: Dec. 28, 2004

(54) WINDOW FOR ALLOWING END POINT OF ETCHING PROCESS TO BE DETECTED AND ETCHING DEVICE COMPRISING THE SAME

(75) Inventors: Jung-Hyun Hwang, Anyang-si (KR); No-Hyun Huh, Yongin-si (KR); Chang-Won Choi, Seoul (KR); Byeung-Wook Choi, Suwon-si (KR); Doo-Won Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 131 days.

(21) Appl. No.: 10/246,674

(22) Filed: Sep. 19, 2002

(65) Prior Publication Data

US 2003/0057182 A1 Mar. 27, 2003

(30) Foreign Application Priority Data

Sep. 21, 2001 (KR) .......................... 2001-58747

(51) Int. Cl.[7] .......................... H05H 1/00; C23C 16/00
(52) U.S. Cl. .................. 156/345.25; 118/712; 118/713
(58) Field of Search .................. 156/345.25, 345.24; 118/712, 713; 204/298.32, 192.33

(56) References Cited

U.S. PATENT DOCUMENTS

| | | | | |
|---|---|---|---|---|
| 4,478,173 A | * | 10/1984 | Doehler | 118/688 |
| 4,479,848 A | * | 10/1984 | Otsubo et al. | 438/16 |
| 4,883,560 A | * | 11/1989 | Ishihara | 216/59 |
| 5,288,367 A | | 2/1994 | Angell et al. | |
| 5,683,538 A | * | 11/1997 | O'Neill et al. | 156/345.28 |
| 5,759,424 A | * | 6/1998 | Imatake et al. | 216/60 |
| 6,344,151 B1 | * | 2/2002 | Chen et al. | 216/60 |
| 6,503,364 B1 | * | 1/2003 | Masuda et al. | 156/345.24 |
| 6,562,186 B1 | * | 5/2003 | Saito et al. | 156/345.24 |

FOREIGN PATENT DOCUMENTS

JP            08096988 A   *  4/1996   ............ H05H/1/46

* cited by examiner

Primary Examiner—Parviz Hassanzadeh
(74) Attorney, Agent, or Firm—Volentine Francos & Whitt, PLLC (57) ABSTRACT

An end point detection window prevents process failures in a plasma etching device. The end point detection window has a body of aluminum or an aluminum alloy through which a hole extends to provide a path along which light generated during the etching process can pass from the process chamber, and a capping section coupled to a light outlet of the body. The capping section is of quartz for allowing the light passing through the hole in the body to be transmitted out of the process chamber.

7 Claims, 7 Drawing Sheets

WINDOW FOR ALLOWING END POINT OF ETCHING PROCESS TO BE DETECTED AND ETCHING DEVICE COMPRISING THE SAME

BACKGROUND OF THE INVENTION

1. Field of the Invention

The present invention relates to the process of etching thin films in the manufacturing of semiconductor devices. More particularly, the present invention relates to a window that allows the end point of an etching process to be determined and to an etching device comprising the same.

2. Description of the Related Art

Currently, semiconductor devices are being developed at a rapid pace due to the widespread use of computers for processing various types of information. Semiconductor devices must operate at high speeds and have the capacity to store a large amount of information. The current art is thus focused on developing and realizing memory devices having a high degree of integration, response speed, and reliability. In this respect, the manufacturing of semiconductor memory devices must include highly precise process techniques, such as thin film forming and etching techniques, if the devices are to be highly integrated.

The etching technique removes predetermined portions of films formed on a semiconductor substrate to produce a desired pattern. These days, the typical design rule of a semiconductor device manufacturing process is less than 0.15 $\mu$m. Accordingly, dry etching devices using plasma are mainly used for etching films on a semiconductor substrate.

Although plasma etching devices differ slightly from one another depending on the method in which they form the plasma, the devices all include a process chamber having a chuck for supporting a substrate, and a plasma forming section. Still further, various elements are provided in the process chamber for ensuring that the film formed on the substrate is etched a precise amount. These elements include an end point detection window for transmitting light generated during the etching process and a detector for sensing the wavelength of the light transmitted through the end point detection window.

An example of a method of and apparatus for detecting the end point of an etching process by sensing the wavelength of the light irradiated during the etching process is disclosed in U.S. Pat. No. 5,288,367 issued to Angell et al.

Angell et al. disclose an end point detection window attached to a sidewall of a process chamber so as to allow the light in the process chamber to be transmitted out of the process chamber. In addition, the end point detection window is made of quartz for effectively transmitting the light.

The side of the end point detection window that faces the interior of the process chamber is referred to as the upper surface of the window, whereas the other side of the end point detection window is referred to as the lower surface. The upper surface of the end point detection window has a hole at the center thereof. The bottom of the hole is blocked at the lower surface of the end point detection window. Therefore, when etching the films, the radiated light passes through the hole formed in the end point detection window. However, plasma ions in the process chamber cannot be transferred to the detector because the bottom of the hole is blocked.

Nonetheless, the conventional end point detection window has several problems.

Firstly, the conventional end point detection window can be easily broken. The frequent replacing of a broken end point detection window adds significantly to the manufacturing cost of the semiconductor devices and requires much down time, thereby lowering the productivity of the manufacturing process.

In addition, the conventional end point detection window generates particles during the etching process. These particles may cause the etching process to fail. More specifically, part of the plasma generated during the etching process collides with the inner wall surface of the detection window that defines the hole therein. As the etching process is continuously performed, the inner wall surface is thus damaged over time.

Generally, the inner wall surface of the quartz end point detection window is processed so as to be smooth. As a result of this process, the inner wall surface has a great deal of grain boundaries. For this reason, portions of the inner wall surface are easily broken. The particles of the broken quartz drop onto films formed on a wafer, which are subject to the etching process. Such quartz particles have a silicon or oxygen component that prevents appointed areas of the films from being etched, thereby creating bridges between patterns.

Figure 1:
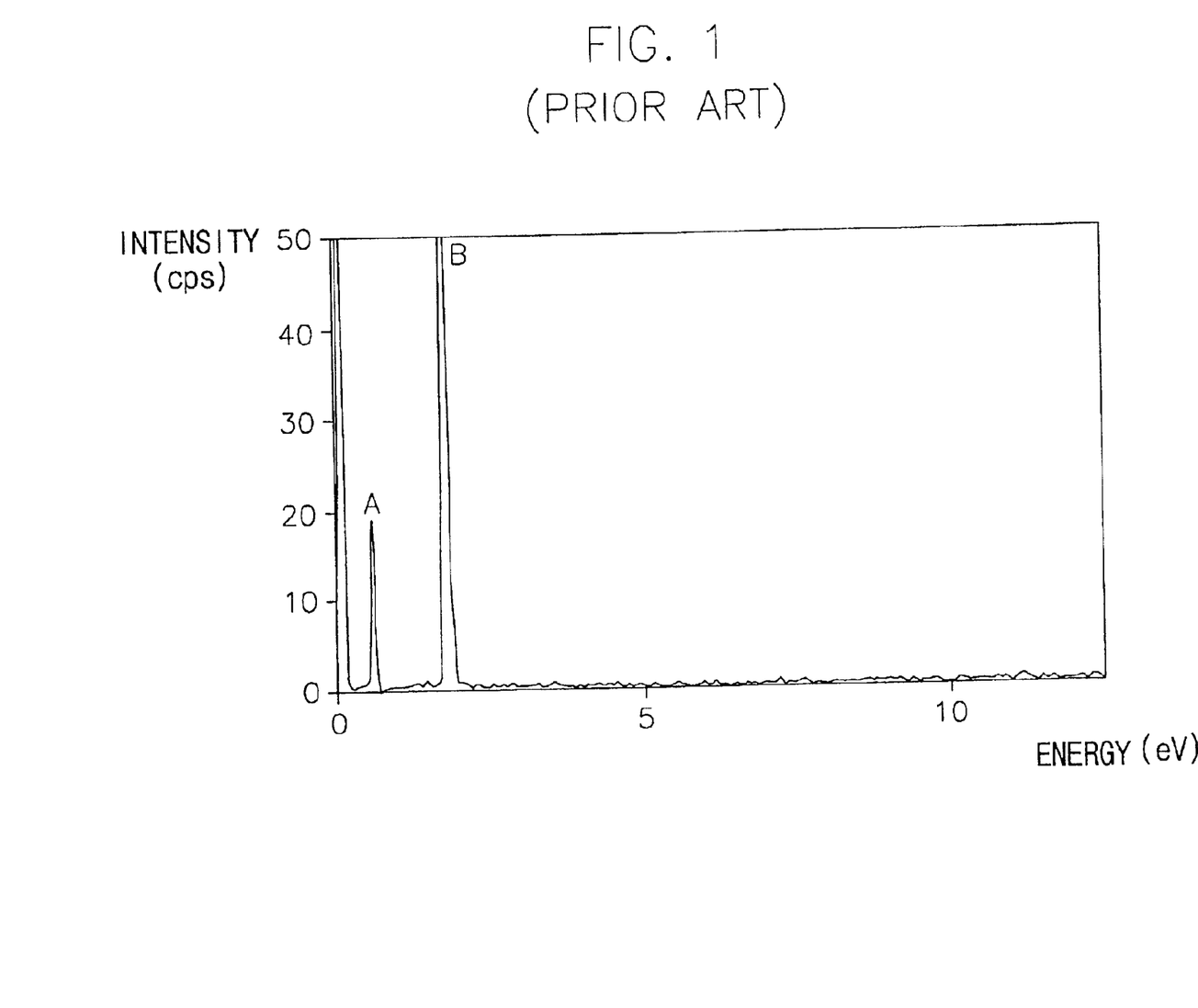
FIG. 1 is a graph showing a componential analysis in a bridge section of a patterned film formed using an etching device having a conventional end point detection window.

FIG. 1 is a graph produced by an EDS (Energy Dispersive X-ray Spectrometer) showing a componential analysis of a bridge section of a patterned film. The patterned film was formed using an etching device having a conventional end point detection window. As shown in the graph, oxygen (A) and silicon (B) are detected in the bridge section. Because the inner wall of the process chamber is made of aluminum or an aluminum alloy, the silicon and oxygen are deemed to derive from particles separated from the quartz end point detection window.

SUMMARY OF THE INVENTION

An object of the present invention is to obviate the above problems of the prior art. Therefore, a first object of the present invention is to provide an end point detection window capable of reducing process failures in an etching process. Likewise, an object of the present invention is to provide an etching device which is not prone to creating process failures.

The end point detection window comprises a body of aluminum or an aluminum alloy attached to a side of the process chamber of the etching device, and a quartz cap coupled to the body. The body has a hole extending therethrough defining a route along which light generated during an etching process can pass. The quartz cap is coupled to a light outlet at the bottom of the hole in the body for allowing light passing through the hole to be transmitted out of the process chamber.

In addition to the process chamber, in which an etching process is carried out for patterning films formed on a substrate, and the end point detection window, the etching device includes a detecting section for detecting the wavelength of light transmitted through the end point detection window. The detection section may include an optical cable having one end connected to the quartz cap, a detector connected to the other end of the optical cable, and an optical filter disposed in the optical cable. The detector may comprise a spectrometer and a PMT (photomultiplier) tube.

The end point detection window of the present invention can withstand the bombardment of plasma ions produced during the etching process. That is, the aluminum or aluminum alloy body of the detection window is hardly abraded by the plasma ions. Therefore, process failures, such as the bridging of patterns formed by the etching process, are minimized.

BRIEF DESCRIPTION OF THE DRAWINGS

The above and other objects, features and advantages of the present invention will become more apparent from the following detailed description of the preferred embodiments thereof made with reference to the attached drawings, of which.

DETAILED DESCRIPTION OF THE PREFERRED EMBODIMENTS

Hereinafter, preferred embodiments of the present invention will be described in detail with reference to accompanying drawings.

Figure 2A:
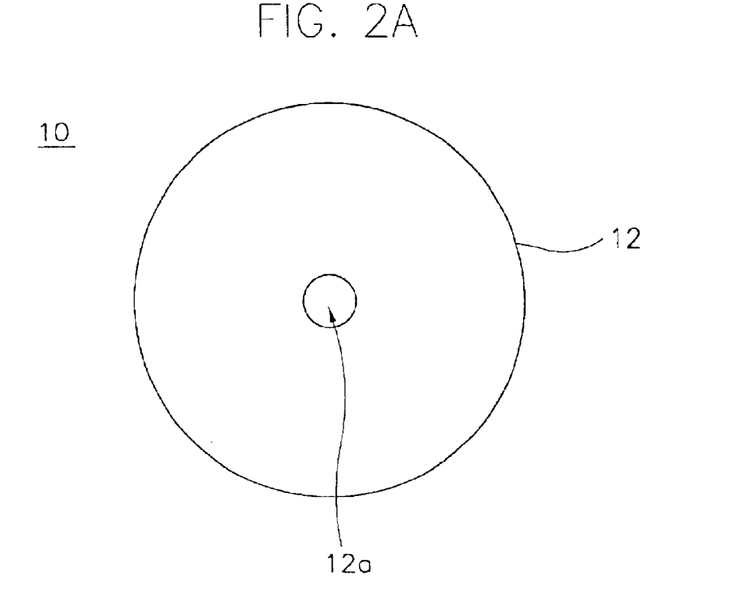
FIG. 2A is a top view of an end point detection window according to the present invention.
Figure 2B:
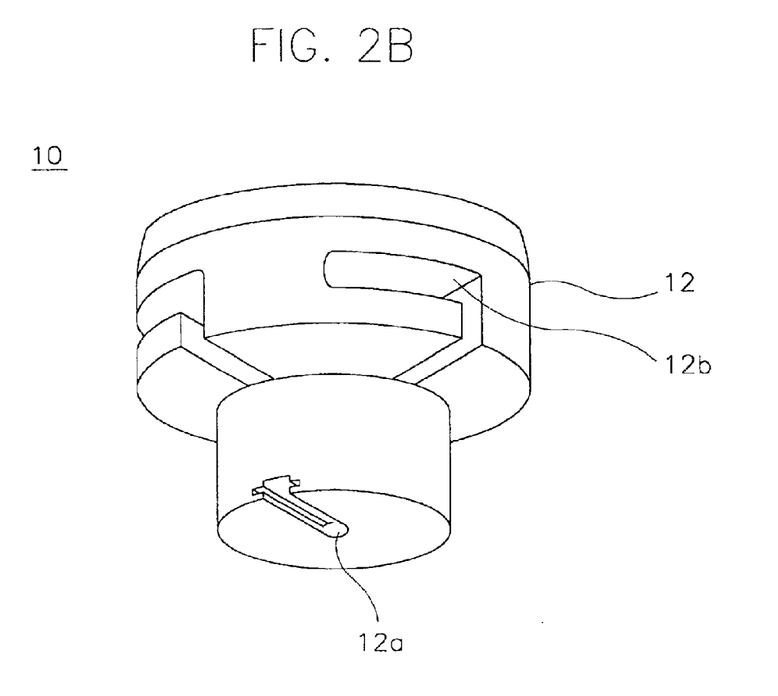
FIG. 2B is a perspective view of the end point detection window according to the present invention.
Figure 2C:
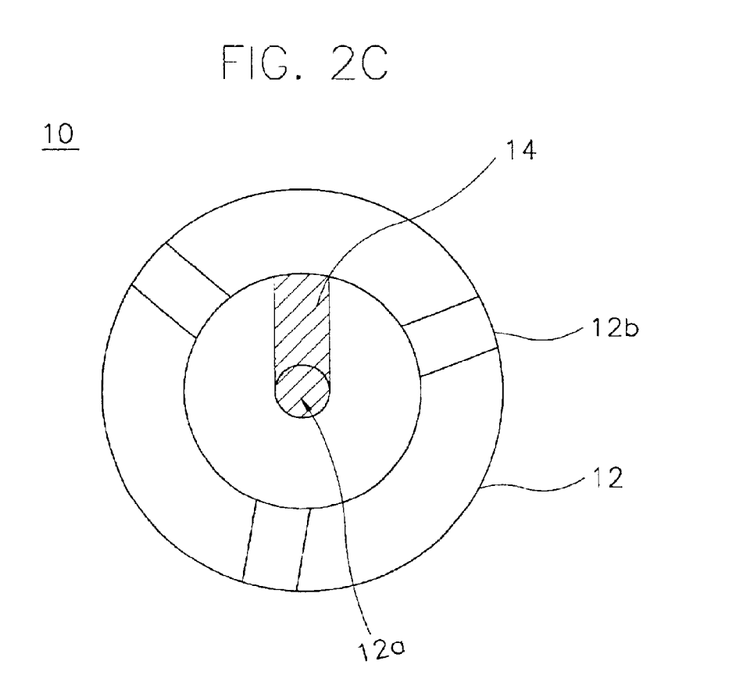
FIG. 2C is a bottom view of an end point detection window according to the present invention.

FIGS. 2A to 2C show an end point detection window according to the present invention. In the description below, the side of the end point detection window that faces the process chamber when the end point detection window is attached to the process chamber will be referred to as the upper portion of the end point detection window.

Referring to FIGS. 2A to 2C, the end point detection window 10 includes a body 12 and a capping section 14. The capping section 14 comprises a quartz cap and is coupled to a predetermined portion of the body 12 through which the light propagates out of the body 12.

The body 12, on the other hand, is made of aluminum or an aluminum alloy. In addition, the body 12 is anodized to form an aluminum oxide ($Al_2O_3$) film on the surface of the body 12. The aluminum oxide ($Al_2O_3$) film improves the corrosion resistance, abrasion resistance and electric resistance of the body 12. In addition, the roughness of the surface is improved, so that the surface is prevented from being damaged when plasma ions collide with the surface during the etching process. Accordingly, process failures, such as arcing, are minimized.

The body 12 has a hole 12a through which light passes during the etching process. In addition, a plurality of first slots 12b are provided in a side of the body 12. Screws inserted into the first slots 12b fix the body to the process chamber.

Figure 3:
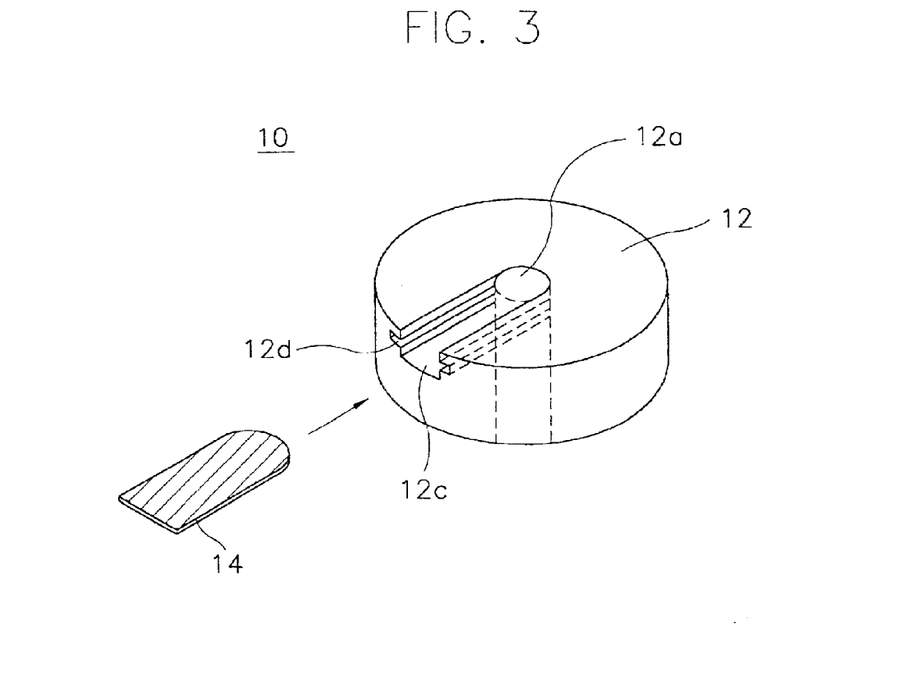
FIG. 3 is a perspective view of a body and a capping section of the end point detection window according to the present invention, showing the way in which they are assembled.

The capping section 14 prevents the plasma ions generated during the etching process from discharging out of the process chamber, and allows the light generated during the etching process to pass therethrough. To this end, the quartz cap of the capping section 14 is coupled to a light outlet of the body 12 through which light is transmitted through the body 12, i.e., the cap covers the bottom of the hole 12a. In particular, the capping section 14 is detachably coupled to the body 12 so that the capping section 14 can be replaced with new one when the capping section 14 is damaged. Various ways can be used to detachably couple the body 12 and the capping section 14. FIG. 3 shows one example of such a detachable coupling.

Referring to FIG. 3, the body 12 has a second slot 12c formed at the bottom of the body 12 and extending from the hole 12a to the outer peripheral surface of the body 12. The second slot 12c is thus contiguous with the bottom of the hole 12a. The width of the second slot 12c is identical to the diameter of the hole 12a. In addition, third slots 12d are formed at both sides of the second slot 12c and extend continuously to the bottom of the hole 12a. The capping section 14 is press-fitted to the body 12 within the third slots 12d. The capping section 14 is a plate shaped such that the capping section 14 fits into the third slots 12d of the body 12 as extending from a periphery of the body 12 to the hole 12a.

In order to allow the capping section 14 to be inserted into the body 12 from the periphery of the body 12 to the hole 12a, the sides of the second slot 12c and the third slots 12d extend parallel to one another from the bottom of the hole 12a to the periphery of the body 12. Although the sides of the second slot 12c are shown as being parallel to one another in the figure, the second slot 12c can be formed such that the distance between the sides thereof increases in a direction from the hole 12a toward the periphery of the body 12.

Figure 4:
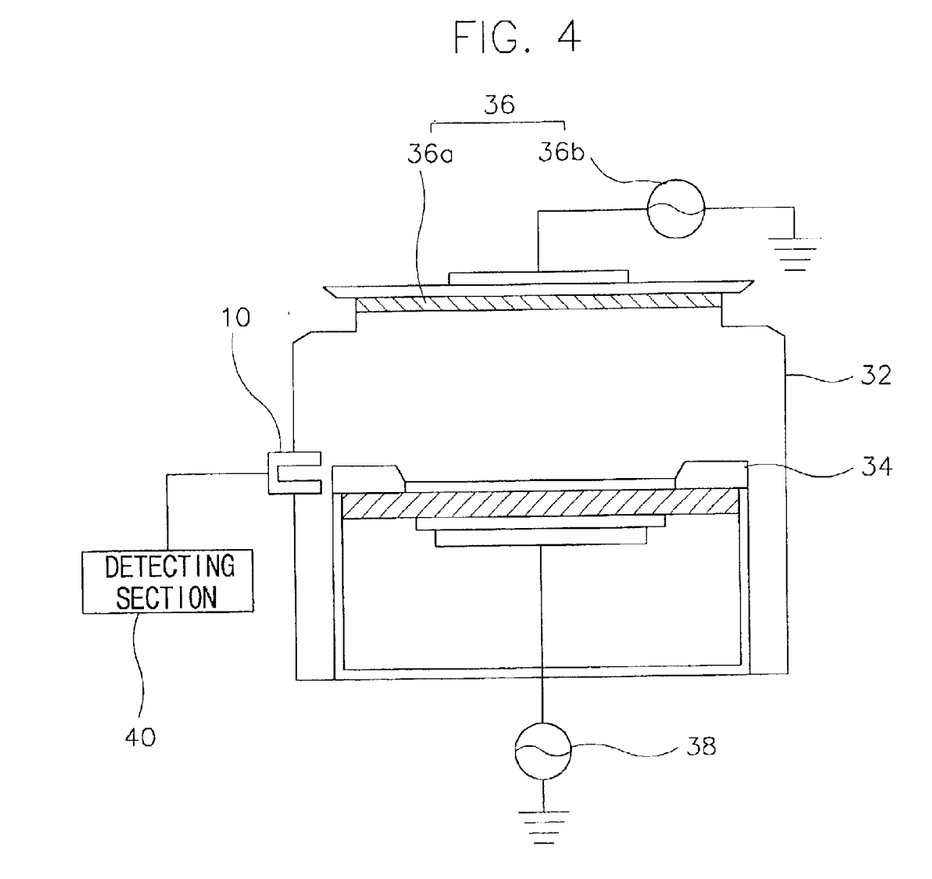
FIG. 4 is a schematic diagram of an etching device according to the present invention.

FIG. 4 shows an etching device according to the present invention. Referring to FIG. 4, a chuck 34, on which a substrate is placed, is provided in a process chamber 32. The substrate is etched in the process chamber 32 to pattern films formed on the substrate. In addition, a plasma forming section 36 is provided to form plasma in the process chamber 32. The plasma forming section 36 includes a plate electrode 36a disposed at an upper portion of the process chamber 32, and an RF power supply 36b for supplying power to the electrode 36a. Therefore, etching gas supplied into the process chamber 32 is converted into plasma. In addition, a bias power supply 38 applies a bias to the chuck 34 to provide a predetermined orientation to the plasma, thereby improving the etching efficiency.

The end point detection window 10 is attached to one side of the process chamber 32 to transmit light, radiated during the etching process, out of the process chamber 32. A detecting section 40 detects the wavelength of the light transmitted through the end point detection window 10. As mentioned above, the end point detection window 10 includes a body 12 having a hole 12a defining the route along which the light generated during the etching process passes through the window, and a quartz capping section 14 attached to the light outlet of the body 12. The body 12 is made of aluminum or an aluminum alloy. The capping section 14 transmits the light passing through the hole 12a, but blocks the plasma ions such that the plasma ions cannot be transferred to the detecting section 40. Therefore, the detecting section 40 is protected from the plasma ions by the capping section 14.

Figure 5:
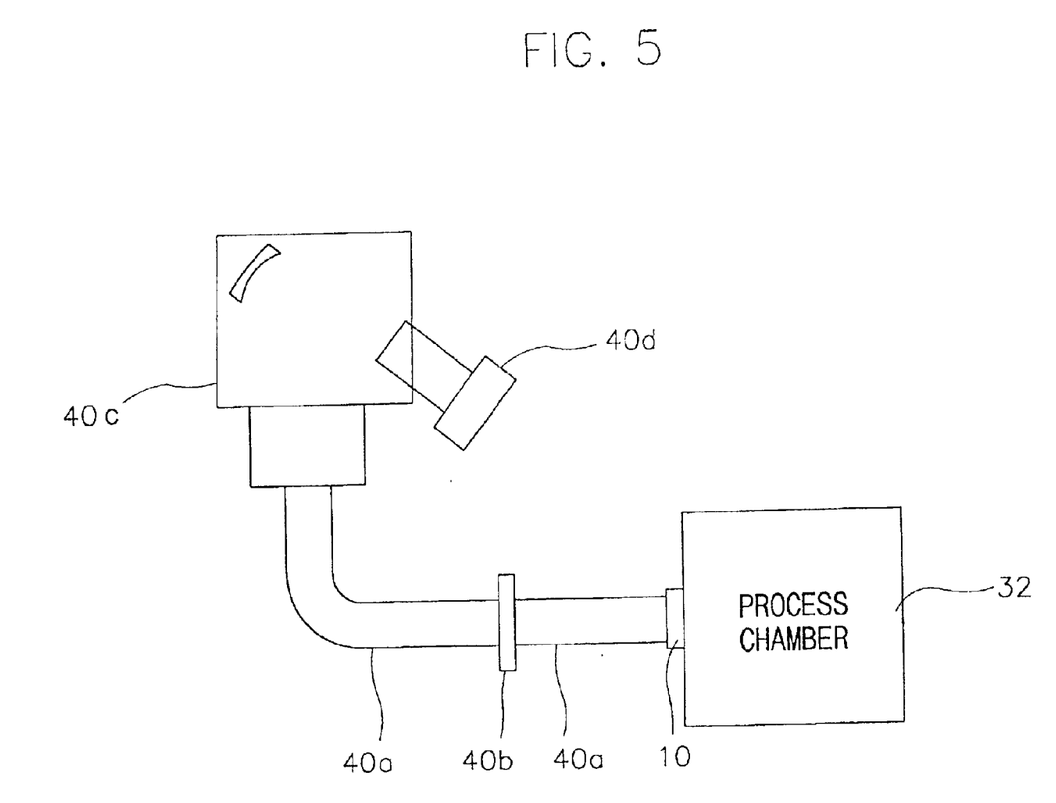
FIG. 5 is a schematic diagram of a detecting section of the etching device according to the present invention.

FIG. 5 shows the detecting section of the etching device. As shown in FIG. 5, the detecting section 40 comprises an optical cable 40a connected to the end point detection window 10 for transferring the light transmitted through the end point detection window 10. An optical filter 40b is provided on the optical cable 40a, such that only light of a certain a wavelength band passes through the optical filter 40b. In addition, a spectrometer 40c is connected to the optical cable 40a to receive the light which has passed through the optical filter 40b. The light is divided by the spectrometer 40c based on the wavelength thereof. A PMT (photomultiplier) tube 40d is provided to amplify the light of a predetermined wavelength which has been divided out by the spectrometer 40c, and to convert the amplified light to an electric signal. When the voltage of the signal produced by the PMT 40d changes a certain amount, the etching of the film formed on the substrate should be terminated, i.e., the end point of the etching process is detected. More specifically, the substrate has a base film thereon, and predetermined films to be etched stop the base film. The base film will thus be etched after the predetermined films have been completely etched. The wavelength of the light radiated during the etching of the base film is different from the wavelength of the light radiated during the etching of the predetermined films. As a result, the voltage of the signal produced by the PMT tube 40d changes once the base film begins to be etched. Accordingly, this change of voltage indicates the end point of the etching process.

A method of forming a pattern on the substrate using the etching device according to the present invention will now be described.

Firstly, a substrate having a multi-layered film thereon is placed on the chuck 34. A photoresist pattern is formed on an uppermost layer as an etch mask. In addition, a process atmosphere suitable for etching the uppermost layer is produced in the process chamber 32. That is, etch gas is supplied into the process chamber 32 and power is applied to the upper electrode 36a. In addition, a bias 38 is applied to the chuck 34 while a predetermined temperature and pressure are maintained in the process chamber 32.

As a result, the etch gas is converted into a plasma. The plasma ions react with the films formed on the substrate such that the films are etched. While the etching process is being carried out, light is generated due to the reaction between the films and the plasma ions. The wavelength of the light depends on the material of the film that reacts with the plasma ions. In any case, the light generated during the etching process is transmitted through the end point detection window 10 to the detecting section, and the detecting section 40 detects the wavelengths of the light, whereby the etching process end point can be discerned.

The end point detection window 10 is highly resistant to being abraded because the body 12 of the end point detection window 10 is made of aluminum or aluminum alloy. Accordingly, the collision of the plasma ions with the upper portion of the end point window 10 exposed to the ions causes minimal damage. That is, few particles are created even when the end point detection window 10 is damaged. As a result, the bridges created when particles fall onto the film that is being etched are minimized. In addition, the end point detection window 10 has a comparatively long useful life which helps keep down the manufacturing cost of the semiconductor devices.

Particle Inspection

Figure 6:
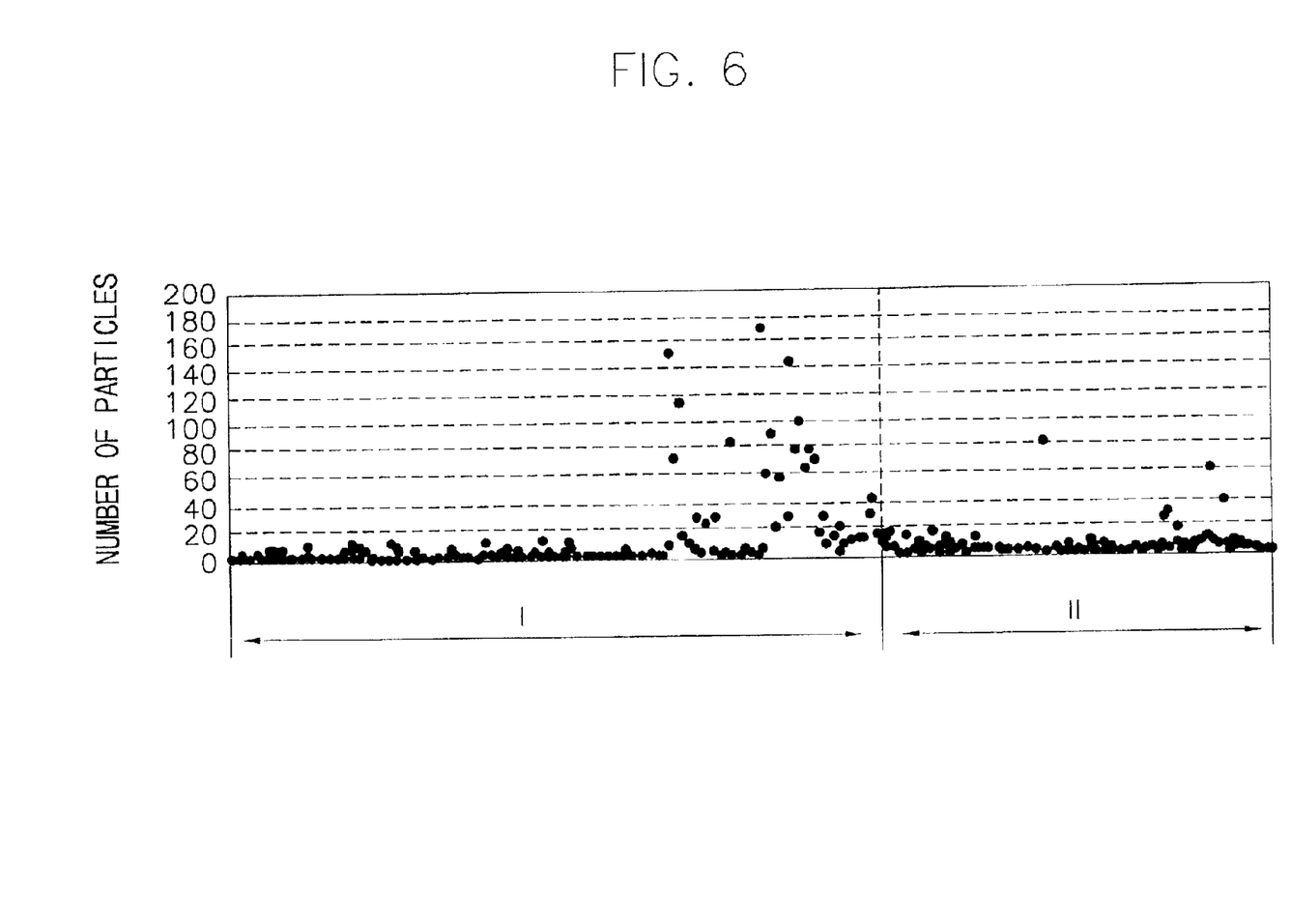
FIGS. 6 and 7 are graphs showing particle distributions after performing an etching process using the conventional etching device and the etching device according to the present invention, respectively.
Figure 7:
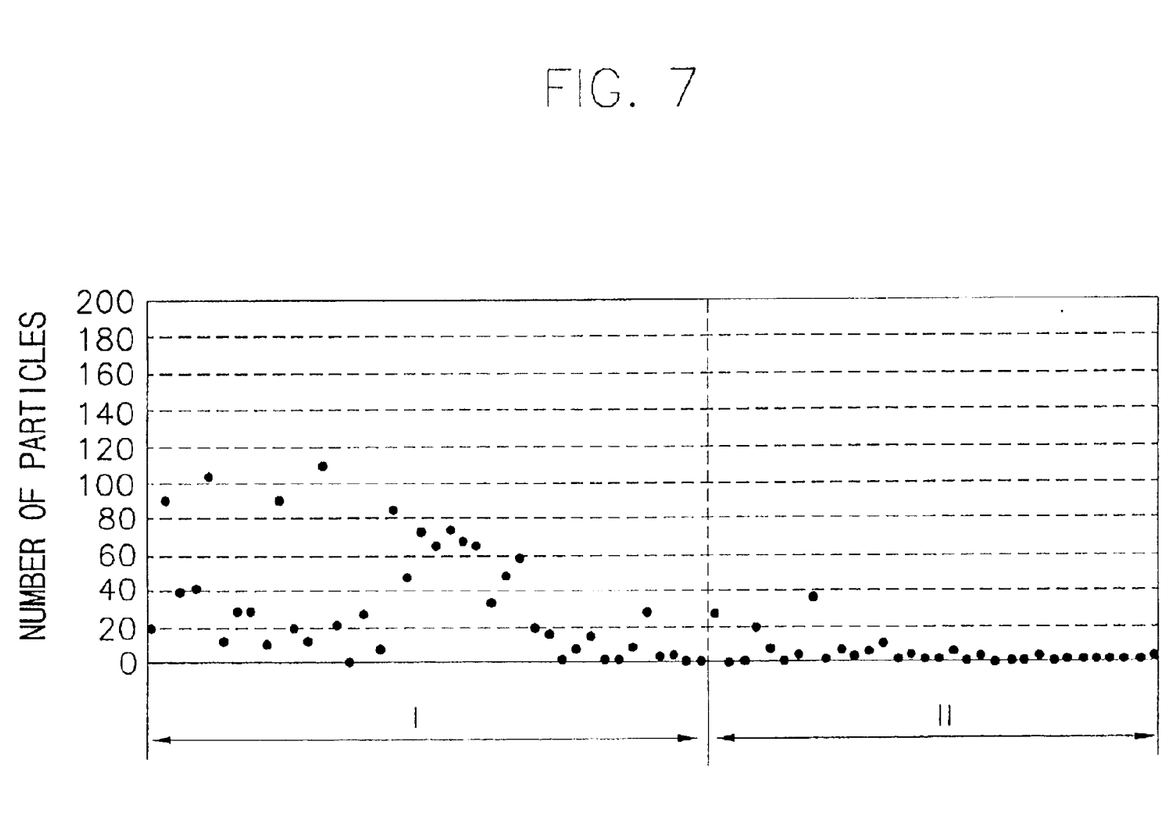

FIGS. 6 and 7 are graphs showing particle distributions after etching processes are performed using the conventional etching device and the etching device according to the present invention, respectively.

More specifically, the graphs show the results of inspections carried out by sampling wafers from each of respective lots on which the etching process was performed. The same etching device was used for each lot with the exception of the end point detection window, which was exchanged (conventional for the one according to the present invention) between lots. In addition, the inspection processes were performed using two discrete but similar etching devices.

In graphs shown in FIGS. 6 and 7, the data in sectionI was obtained using the conventional end point detection window and the data in section II was obtained using the end point detection window according to the present invention.

In the graphs, each plotted point represents the number of particles found on a respective wafer sampled from a lot. That is, each point shows the level of particles of a wafer lot. As shown in the graphs, when an etching device employing the conventional end point detection window is used, a greater number of particles are produced on the wafers in a lot than when an etching device employing the end point window of the present invention is used. In particular, when an etching device employing the conventional end point detection window is used, the number of particles found on wafers etched in succession periodically increases. Accordingly, it can be seen that the conventional end point detection window is damaged at a predetermined point of time in the course of carrying out the etching processes continuously, whereupon the particles drop onto the wafer.

Hereinafter, FIGS. 6 and 7 will be described further with reference to table 1.

TABLE 1

| | Inspected lot | Normal lots | Particle presenting lot | Rate of normal lots |
|---|---|---|---|---|
| Conventional etching device #1 (FIG.6) | 191 | 166 | 25 | 86% |
| Conventional etching device #2 (FIG. 7) | 38 | 16 | 22 | 42% |
| Total | 229 | 182 | 47 | 78% |
| Etching device of present inventio #1 (FIG. 6) | 31 | 27 | 4 | 87% |
| Etching device of present inventio #2 (FIG. 7) | 34 | 32 | 2 | 94% |
| Total | 65 | 59 | 6 | 91% |

In Table 1, a normal lot refers to a lot in which the wafer sampled has fewer than 20 measured particles. As can be seen from Table 1, the etching device employing the conventional end point detection window produces normal lots at a rate of about 78%. On the contrary, the etching device employing the end point detection window of the present invention produces normal lots at a rate of about 91%. Therefore, the end point detection window of the present invention effectively reduces the number of particles produced during the course of etching lots of wafers.

Although the present invention has been described in detail with reference to the preferred embodiment thereof, various changes to, substitutions and alterations of the preferred embodiment will become apparent to those skilled in the art. All such changes, substitutions and alterations are seen to be within the true spirit and scope of the invention as defined by the appended claims.

What is claimed is:

1. An end point detection window of an etching device, the end point detection window comprising:

a body of aluminum or an aluminum alloy, said body having a hole extending longitudinally therethrough defining a route along which light generated during an etching process can pass, a second slot and third slots in the bottom thereof, said second slot extending radially from the bottom of said hole to an outer peripheral surface of the body, and said third slots open at opposing sides of the second slot, respectively, and extending in a direction from the bottom of said hole to the outer peripheral surface of the body, and said body having a light outlet at which the bottom of said hole is located; and a quartz cap fitted to said body within the third slots thereof, said quartz cap spanning the second slot and covering the bottom of said hole in the body, whereby light passing through the hole in the body is allowed to pass through the window and plasma ions are prevented from passing through the window, and said quartz cap being slidable radially of said hole along said third slots into and out of said body so as to be detachably coupled to said light outlet of the body.

2. The end point detection window as claimed in claim 1, wherein said body has an oxide aluminum ($Al_2O_3$) film forming an outer surface thereof.

3. The end point detection window as claimed in claim 1, wherein the body has first slots in an outer surface thereof that allow the body to be fixed to a process chamber.

4. An etching device for use in manufacturing semiconductor devices, the etching device comprising:

a process chamber in which an etching process is carried out for patterning films formed on a substrate;

an end point detection window attached to one side of the process chamber so as to transmit light generated during the etching process out of the process chamber, said end point detection window including a body of aluminum or an aluminum alloy and a quartz cap, said body having a hole extending therethrough defining a route along which light generated during the etching process can pass through the window, a second slot and third slots in the bottom thereof, said second slot extending radially from the bottom of said hole to an outer peripheral surface of the body, and said third slots open at opposing sides of the second slot, respectively, and extending in a direction from the bottom of said hole to the outer peripheral surface of the body, and said body having a light outlet at which the bottom of said hole is located, said quartz cap fitted to said body within the third slots thereof, said quartz cap spanning the second slot and covering the bottom of said hole in the body, whereby light passing through the hole in the body is allowed to pass through the window and plasma ions are prevented from passing through the window, and said quartz cap being slidable radially of said hole along said third slots into and out of said body so as to be detachably coupled to said light outlet of the body; and a detecting section connected to said end point detection window, said detection section including a detector operable to detect the wavelength of light transmitted through the quartz cap of the end point detection window.

5. The etching device as claimed in claim 4, wherein said body has an oxide aluminum ($Al_2O_3$) film forming an outer surface thereof.

6. The etching device as claimed in claim 4, wherein said detection section further comprises an optical cable connecting the end point detection window to said detector.

7. The etching device as claimed in claim 4, wherein the detecting section includes an optical filter interposed between said end point detection window and said detector for allowing light having a predetermined wavelength band to pass therethrough, and said detector comprises a spectrometer, and a photomultiplier tube that amplifies light of a predetermined wavelength and converts the amplified light to an electric signal.

* * * * *